United States Patent
Toda

(10) Patent No.: US 6,522,280 B2
(45) Date of Patent: Feb. 18, 2003

(54) ADJUSTABLE DIGITAL-TO-ANALOG CONVERTER

(75) Inventor: Akihiko Toda, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/821,285

(22) Filed: Mar. 29, 2001

(65) Prior Publication Data

US 2001/0026236 A1 Oct. 4, 2001

(30) Foreign Application Priority Data

Mar. 31, 2000 (JP) ...................................... 2000-099624

(51) Int. Cl.[7] ................................................. H03M 1/68
(52) U.S. Cl. ...................................... 341/145; 341/154
(58) Field of Search .......................................... 341/145

(56) References Cited

U.S. PATENT DOCUMENTS 5,283,579 A * 2/1994 Tasdighi et al. ............ 341/145
5,742,245 A * 4/1998 Noro ........................... 341/145

FOREIGN PATENT DOCUMENTS

| JP | 07-170188 | * 7/1995 | ............ H03M/1/76 |
| WO | WO 01/41310 A1 | 6/2001 | |
| WO | WO 01/41311 A1 | 6/2001 | |

* cited by examiner

Primary Examiner—Howard L. Williams
(74) Attorney, Agent, or Firm—Pillsbury Winthrop LLP

(57) ABSTRACT

A digital-to-analog-converter is provided which allows a use to set the reference voltage as desired and therefore has improved flexibility. A more significant bit data conversion section converts more significant bit data of digital data into a more significant analog signal corresponding to the more significant bit data by using a reference voltage inputted from outside. A less significant bit data conversion section converts less significant bit data of the digital data into a less significant analog signal corresponding to the less significant bit data. A controller controls the less significant bit data conversion section in such a manner as to output the less significant analog signal according to the reference voltage. An adder adds the more significant analog signal and the less significant analog signal, thereby outputting an analog signal corresponding to the digital data.

8 Claims, 3 Drawing Sheets

ADJUSTABLE DIGITAL-TO-ANALOG CONVERTER

BACKGROUND OF THE INVENTION

1. Field of the Invention

This invention relates to a digital-to-analog converter (hereinafter referred to as D/A) that converts multi-bit digital data into an analog signal by dividing the digital data into more significant bit data and less significant bit data, converting them into respective analog signals and then carrying out analog addition of the converted analog signals.

2. Description of Related Art

Conventionally, a multi-bit D/A converter is known which is formed of a resistor string and CMOS transistors. This resistor string D/A converter has a high output impedance, and thus, its output current must be received by a high input impedance circuit. For this reason, an adder formed by an operational amplifier is ordinarily provided at an output stage of the D/A converter.

Although the above resistor string D/A converter performs D/A conversion with high accuracy, it has a disadvantage that the increase in the number of bits to be converted results in increase in the number of resistors used. This causes the increase in the size of an integrated circuit that constitutes the D/A converter because a large space is required for the resistors.

To overcome this disadvantage, there has been proposed a circuit as disclosed by Japanese Laid-Open Patent Publication (Kokai) No. 8-307273. FIG. 3 shows an example of the circuit arrangement of a D/A converter disclosed in this publication. In this circuit arrangement, a conventional resistor string D/A conversion section 11 converts fourteen more significant bit data of 16-bit digital data into a corresponding analog voltage signal (hereinafter referred to as more significant analog voltage signal), and a current mirror circuit 12 converts two less significant bit data of the 16-bit digital data into corresponding analog current signals (hereinafter referred to as less significant analog current signals). An adder 13 and a current switching circuit 14 convert the analog current signals corresponding to the less significant bit data into a corresponding analog voltage signal (hereinafter referred to as less significant analog voltage signal), and at the same time, add the less significant analog voltage signal to the more significant analog voltage signal. The resulting signal is then outputted from an output of an operational amplifier of the adder 13 as an output signal from the D/A converter.

With this arrangement in which all of the 16-bit digital data are converted into the corresponding analog voltage signals, the above D/A converter can reduce its size compared with the D/A converter comprised of the resistor string and the CMOS transistors and make it easier to increase the number of bits for conversion.

The above conventional D/A converter, however, has the necessity of presetting a resistance value r12 of a resistor R12 and current values i2, i3 of currents I2, I3 flowing through transistors Q2, Q3 according to a set value of voltage (reference voltage) of a reference power supply to the D/A converter, which is inputted from the outside. More specifically, the adder 13 must add the more significant analog voltage signal and the less significant analog voltage signal on correct analog voltage levels corresponding to respective bit positions. This necessitates presetting the resistance value r12 and the current values i2, i3 so that voltage values corresponding to the two less significant bit data are ½ and ¼ of a voltage value of least significant bit data of the more significant bit data that is converted by the D/A conversion section 11. It is therefore difficult for a user to change the reference voltage as desired once the D/A converter as a whole is designed. Thus, the conventional D/A converter lacks flexibility.

SUMMARY OF THE INVENTION

It is an object of the present invention to provide a digital-to-analog-converter which allows a use to set the reference voltage as desired and therefore has improved flexibility.

To attain the above object, the present invention provides a digital-to-analog converter comprising a more significant data converting device that converts more significant bit data of digital data into a more significant analog signal corresponding to the more significant bit data by using a reference voltage inputted from outside, a less significant data converting device that converts less significant bit data of the digital data into a less significant analog signal corresponding to the less significant bit data, a control device that controls the less significant data converting device in such a manner as to output the less significant analog signal according to the reference voltage, and an adding device that adds the more significant analog signal and the less significant analog signal, thereby outputting an analog signal corresponding to the digital data.

With the above arrangement of the present invention, the control device can automatically output the less significant analog signal according to the reference voltage which is a reference voltage of the more significant analog signal. As a result, the user can set the reference voltage as desired, and thus, the digital-to-analog converter according to the present invention has improved flexibility.

Preferably, the more significant data converting device comprises a voltage output device that outputs a more significant analog voltage signal having a voltage corresponding to the more significant bit data by using the reference voltage.

Also preferably, the less significant data converting device comprises a current output device that outputs a less significant analog current signal having a current corresponding to the less significant bit data.

More preferably, the control device comprises a regulating device that detects a predetermined voltage within the reference voltage and regulates a current value of the less significant analog current signal according to the detected voltage.

Further preferably, the adding device comprises a current-to-voltage converting device that converts the less significant analog current signal into a less significant analog voltage signal and adds the less significant analog voltage signal to the more significant analog voltage signal.

With these preferable arrangements of the present invention, the current of the less significant analog current signal can be automatically adjusted according to the reference voltage which is a reference voltage of the more significant analog voltatage signal, and as a result, the user can set the reference voltage as desired, whereby the flexibility of the digital-to-analog converter can be improved. Further, the more significant data converting device, which is a voltage-mode digital-to-analog converter generally having a high conversion accuracy, can convert the more significant bit data into the more signiciant analog voltage signal, while the less significant data converting device, which is a current-mode digital-to analog converter generally having a small circuit area, can convert the less significant bit data into the less significant current signal, and therefore highly accurate digital-to-analog conversion can be achieved with a reduced circuit circuit area.

Preferably, the voltage output device comprises a more significant reference voltage terminal supplied with a more significant reference voltage of the reference voltage, a less significant reference voltage terminal supplied with a less significant voltage of the reference voltage, and a resistor string having one end thereof connected to the more significant reference voltage terminal and another end thereof connected to the less significant reference voltage terminal, and having a plurality of outputs, for dividing the reference voltage in divided voltages corresponding in number to a number of bits of the more significant bit data and outputting the divided voltages from the plurality of outputs.

More preferably, the regulating device comprises to a power supply at a high potential side, a MOS transistor having one end thereof connected to the power supply, a resistor having one end thereof connected to the MOS transistor and another end thereof connected to the other end of the resistor string, a differential circuit having a first input connected to a junction between the MOS transistor and the resistor, a second input connected to a predetermined one of the plurality of outputs of the resistor string, and an output connected to a gate of the MOS transistor, and a current sinking device that sinks a current flowing into the other end of the resistor string from the MOS transistor through the resistor, from the one end of the resistor string.

With these prefeerable arrangements of the present invention, the current sinking device can sink the current flowing into the lower end of the resistor string from the MOS transistor through the resistor. As a result, the more significant and less significant reference voltages can be reliably supplied even from the resistors which have low current driving ability, without an extra current flowing through the resistor string, which can further improve the flexibility of the digital-to-analog converter.

The above and other objects, features, and advantages of the invention will become more apparent from the following detailed description taken in conjunction with the accompanying drawings.

DETAILED DESCRIPTION OF THE PREFERRED EMBODIMENTS

Preferred embodiments of the present invention will be described hereinbelow with reference to the accompanying drawings. The following description relates to a case where (n+m) bit digital data (n and m are arbitrary integers) are divided into more significant n bit data and less significant m bit data and converted from a digital form to an analog form.

Figure 1:
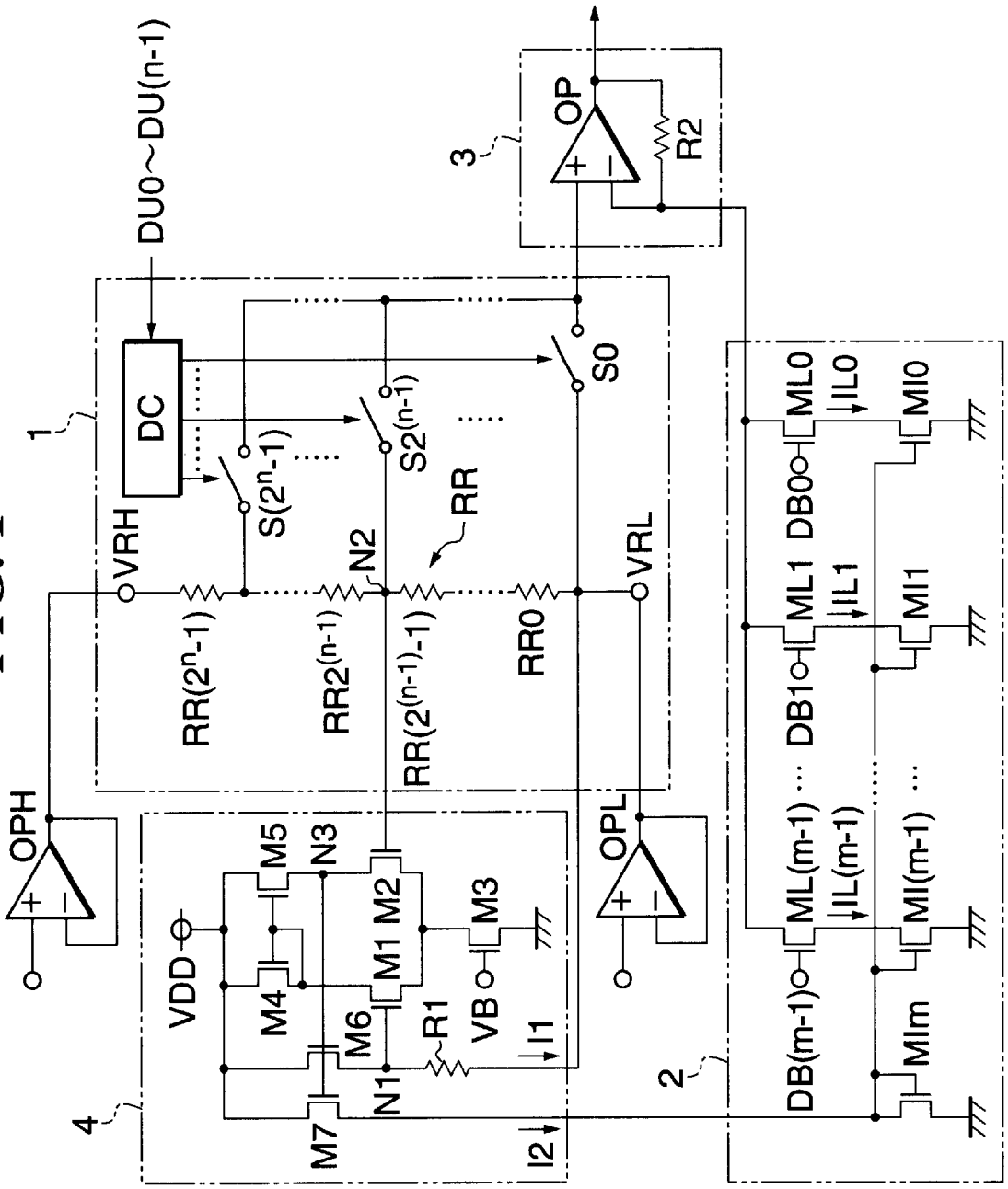
FIG. 1 is a circuit diagram showing the circuit arrangement of a digital-to-analog converter according to a first embodiment of the present invention.

Referring first to FIG. 1, a detailed description will be given of a D/A converter according to a first embodiment of the present invention. FIG. 1 is a circuit diagram showing the circuit arrangement of the D/A converter according to the first embodiment. The D/A converter in FIG. 1 is constructed such that reference voltages (a more significant voltage (at a high potential side) and a less significant reference voltage (at a low potential side)) are supplied from an operational amplifier with a high current-driving capability. Alternatively, however, the D/A converter may be constructed such that the reference voltages are supplied from another device such as a regulator having a high current-driving capability.

As shown in FIG. 1, the D/A converter is comprised of a more significant bit data conversion section 1 for converting more significant n bit data DU0–DU(n−1) of (n+m) bit digital data into a more significant analog voltage signal, a less significant bit data conversion section 2 for converting less significant m bit data DB0–DB(m−1) of the (n+m) bit digital data into a less significant analog current signal; an adder 3 for converting the less significant analog current signal into a less significant analog voltage signal and adding the less significant analog voltage signal to the more significant analog voltage signal, and a controller 4 for supplying a current corresponding to a reference voltage, which is produced from a more significant voltage vrh and a less significant voltage vrl, to the less significant bit data conversion section 2.

The more significant bit data conversion section 1 has a resistor string RR comprised of $2^n$ resistors RR0 to RR($2^n$−1), $2^n$ CMOS switches S0 to S($2^n$−1), and a decoder DC. The resistors RR0 to RR($2^n$−1) are connected in series. The resistor string RR has a more significant reference voltage terminal VRH that is supplied with the more significant reference voltage vrh from an external operational amplifier OPH, and a less significant reference voltage terminal VRL that is supplied with the less significant reference voltage vrl from an external operational amplifier OPL. The respective inputs of the switches S0 to S($2^n$−1) are connected to junctions between the resistors RR0 to RR($2^n$−1), and the respective outputs thereof are connected to the adder 3. The decoder DC receives and decodes the data more significant n bit data DU0 to DU(n−1), and outputs control signals corresponding to results of the decoding to the switches S0 to S($2^n$−1). The respective switches S0 to S($2^n$−1) are connected or disconnected according to the received control signals.

The controller 4 is comprised of n channel MOS transistors M1 to M3, p channel transistors M4 to M7, and a resistor R1. The transistor M1 has a gate as a non-inverting input connected to a node N1; a drain connected to a drain and gate of the transistor M4; and a source connected to a drain of the transistor M3. The transistor M2 has a gate as an inverting input connected to a node N2, which is a median point of the resistor string RR of the more significant bit data converter 1; a drain connected to a drain of the transistor M5 at a node N3 as an output terminal; and a source connected to the drain of the transistor M3. The transistor M5 has a gate connected to the gate and drain of the transistor M4, and respective sources of the transistors M4, M5 are connected to a power supply VDD at a high potential side. The transistor M3 has a gate that is connected to a bias power supply VB, which supplies a predetermined bias voltage; and a source that is grounded. Therefore, the receiving transistors M1, M2, the loading transistors M4, M5 and the transistor 3 as a constant current source constitute a differential circuit.

The transistor M6 has a gate connected to the node N3, a source connected to the power supply VDD, and a drain connected to the gate of the transistor M1 and one end of the resistor R1 at the node N1. The resistor R1 has the other end thereof connected to a lower end of the resistor string RR. The transistor M7 has a gate connected to the gate of the transistor M6, a source connected to the power supply VDD, and a drain connected to the less significant bit data conversion section 2.

The less significant bit data conversion section 2 is comprised of n channel MOS transistors ML0 to ML(m−1) and MI0 to MIm. The transistor MIm has a gate and a drain that are connected to the drain of the transistor M7 in the controller 4, and a source that is grounded. Each of the transistors MI0 to MI(m−1) has a source grounded and a gate connected to the gate of the transistor MIm. The transistors MI0 to MIm constitute a current mirror circuit. Each of the transistors ML0 to ML(m−1) has a gate that receives corresponding data of the less significant m bit data DB0 to DB(m−1), a source connected to a drain of a corresponding one of the transistors MI0 to MI(m−1), and a drain connected to the adder 3.

The adder 3 is comprised of an operational amplifier OP and a feedback resistor R2. The adder 3 is constructed as follows: The operational amplifier OP has a non-inverting input connected to the respective outputs of the switches S0 to S($2^n$−1), and an inverting input connected to the respective drains of the transistors ML0 to ML(m−1) in the less significant bit data conversion section 2. The resistor R2 is connected between an output and the inverting input of the operational amplifier OP. The adder 3 functions as a non-inverting amplifier with a feedback gain of 1, which receives voltage of the more significant analog voltage signal from the more significant bit data conversion section 1 at a high input impedance and leads the received voltage as it is to an output terminal thereof. The adder 3 also converts the less significant analog current signal into a less significant analog voltage signal, and adds the less significant analog voltage signal to the more significant analog voltage signal. The resulting signal is outputted as an output signal from the D/A converter.

There will now be described the operation of the D/A converter constructed as described above. First, a description will be given of the operation of the more significant bit data conversion section 1. The decoder DC decodes the more significant n bit data DU0 to DU(n−1) of the digital data inputted for conversion, and outputs the control signals to the switches S0 to S($2^n$−1) in order to turn on one of these switches (turn off the other switches) according to results of the decoding. Consequently, among voltages that are divided from a voltage between the more significant reference voltage vrh and the less significant reference voltage vrl according to the number of more significant bits by the resistors RR0 to RR($2^n$−1), a voltage corresponding to the more significant bit data is outputted as the more significant analog voltage signal to the adder 3 through the turned-on switches.

For example, if all of the more significant n bit data DU0 to DU(n−1) are "0", the switch S0 is turned on and the other switches are turned off, so that a voltage at a lower end of the resistor RR0 is outputted. If all of the more significant n bit data DU0 to DU(n−1) are "1", the switch S($2^n$−1) is turned on and the other switches are turned off, so that a voltage at a lower end of the resistor RR($2^n$−1) is outputted.

There will now be described the operation of the controller 4. If a voltage at the node N1 of the differential circuit comprised of the transistors M1 to M5 is higher than a voltage at the node N2, a voltage at the gate of the transistor M6 rises to reduce a current I1 flowing through the resistor R1 and lower the voltage at the node N1. On the other hand, if a voltage at the node N1 is lower than a voltage at the node N2, a voltage at the gate of the transistor M6 lowers to increase the current I1 flowing through the resistor R1 and raise the voltage at the node N1. Therefore, due to this action of the differential circuit, the voltage at the node N1 becomes equal to the voltage at the node N2, i.e., a voltage at the median point of the resistor string, and hence the current I1 flowing through the resistor R1 has a current value i1 corresponding to the voltage between the more significant reference voltage vrh and the less significant reference voltage vrl.

Since the gate of the transistor M7 is connected to the node N3, a current I2 supplied to the less significant bit data conversion section 2 by the transistor M7 also has the current value i1. As a result, the less significant bit data conversion section 2 is supplied with the current I2 having the current value i1 corresponding to the voltage between the more significant reference voltage vrh and the less significant reference voltage vrl. The current I1 flowing through the resistor R1 flows into the resistor string RR through the lower end thereof, but the current I1 will not affect the conversion of the more significant n bit data because the operational amplifiers OPH, OPL of the present embodiment, which are used for providing the more significant reference voltage vrh and the less significant reference voltage vrl, can absorb the current I1 due to their high current-driving capability.

There will now be described the operation of the less significant bit data conversion section 2. The transistor MIm, which receives the current I2, and the transistors MI0 to MI(m−1) constitute the current mirror circuit, and thus, currents IL0 to IL(m−1) corresponding to the current I2 flow through the respective transistors MI0 to MI(m−1). The respective gate widths of the transistors MI0 to MI(m−1) are determined in such a manner that the respective current values of the currents IL0 to IL(m−1) flowing through these transistors are doubled as the corresponding number of bits is increased. That is, assuming that the transistor MIm has a gate width of W, the transistor MI0 has a gate width of W and the transistor MI1 has a gate width of 2W. The gate widths of the subsequent transistors are determined in the same manner, and the last transistor MI(m−1) has a gate width of $2^{(m-1)}$W.

Thus, the current IL0, which flows through the transistor MI0 corresponding to the least significant bit of the less significant bit data, has the current value i1 as is the case with the current flowing through the transistor MIm. The current IL1 flowing through the transistor MI1 corresponding to the next bit has a current value of 2×i1. The current values of the subsequent currents are determined in the same manner, and the last current IL(m−1) flowing through the transistor MI(m−1) has a current value of $2^{(m-1)}$×i1.

The respective gates of the transistors ML0 to ML(m−1) receive corresponding data of the less significant m bit data. Among the transistors ML0 to ML(m−1), the transistor(s) receiving the data of "1" is(are) turned on and the transistor (s) receiving the data of "0" is(are) turned off. Only current (s) corresponding to the data of "1" is(are) outputted to the adder 3 through the transistors ML0 to ML(m−1).

For example, if the less significant bit data DB0 is "1" and the other data are "0", the transistor ML0 is turned on and the other transistors are turned off, so that the current IL0 having the current value i1 is outputted. If the less significant bit data DB1 and DB(m−1) are "1" and the other data are "0", the transistors ML1 and ML(m−1) are turned on and the other transistors are turned off, so that the current IL1 having the current value of 2×i1 and the current IL(m−1) having the current value of $2^{(m-1)} \times i1$ are added together, whereby a current having a current value of $(2 \times i1 + 2^{(m-1)} \times i1)$ is outputted. Thus, the currents corresponding to the data "1" of the less significant bit data DB0 to DB(m−1) are added together, so that the less significant analog current signal having the current value corresponding to the less significant bit data DB0 to DB(m−1) is outputted to the adder 3.

There will now be described the operation of the adder 3. The operational amplifier OP converts the less significant analog current signal, which is inputted through the non-inverting input, into the less significant analog voltage signal, and adds the less significant analog voltage signal to the more significant analog voltage signal that is inputted through the non-inverting input, and outputs the resulting voltage signal. Assuming that a voltage between the more significant reference voltage vrh and the less significant reference voltage vrl supplied to the more significant bit data conversion section 1 is vr and the resistance value of the resistor R2 is r2, the current value i1 and the resistance value r2 are determined such that a voltage outputted from the operational amplifier OP as a result of the conversion from the current IL0 corresponding to the least significant bit data DB0 of the less significant m bit data has a minimum width in the case where the (n+m) bit digital data are converted into an analog signal, and the following equation (1) is satisfied:

$$i1 \times r2 = vr/2^{n+m} \tag{1}$$

Since the voltage at the node N1 is equal to the voltage at the node N2, the following equation (2) is formulated;

$$I1 \times r1 = vr/2 \tag{2}$$

By the above equations (1) and (2), the resistance value r1 of the resistor R1 is determined as being $r2 \times 2^{(n+m-1)}$, so that the less significant analog voltage signal corresponds to the more significant analog voltage signal. It is therefore possible to output the analog signal that is converted from the (n+m) bit data in the following manner: the more significant n bit data is converted into the more significant analog voltage signal; the less significant m bit data is converted into the less significant analog current signal, which is then converted into the less significant analog voltage signal; and the less significant voltage signal and the more significant analog voltage signal are added together.

As described above, according to the D/A converter of the first embodiment, the voltage at the median point between the more significant reference voltage vrh and the less significant reference voltage vrl is detected, and the currents IL0 to IL(m−1) having the current values i1 to $2^{(m-1)} \times i1$, which are obtained by multiplying the current value i1 a predetermined number of times, are produced according to the current I2 having the current value i1 corresponding to the detected voltage and the number of less significant bits. The currents IL0 to IL(m−1) are then added together in an appropriate manner according to the less significant bit data to thereby produce the less significant analog current signal. Thus, the current value of the less significant analog current signal can be adjusted automatically according to the width of the voltage between the more significant reference voltage vrh and the less significant reference voltage vrl. This makes it possible for a user to arbitrarily change the more significant reference voltage vrh and the less significant reference voltage vrl, and therefore improves the flexibility of the D/A converter.

Figure 2:
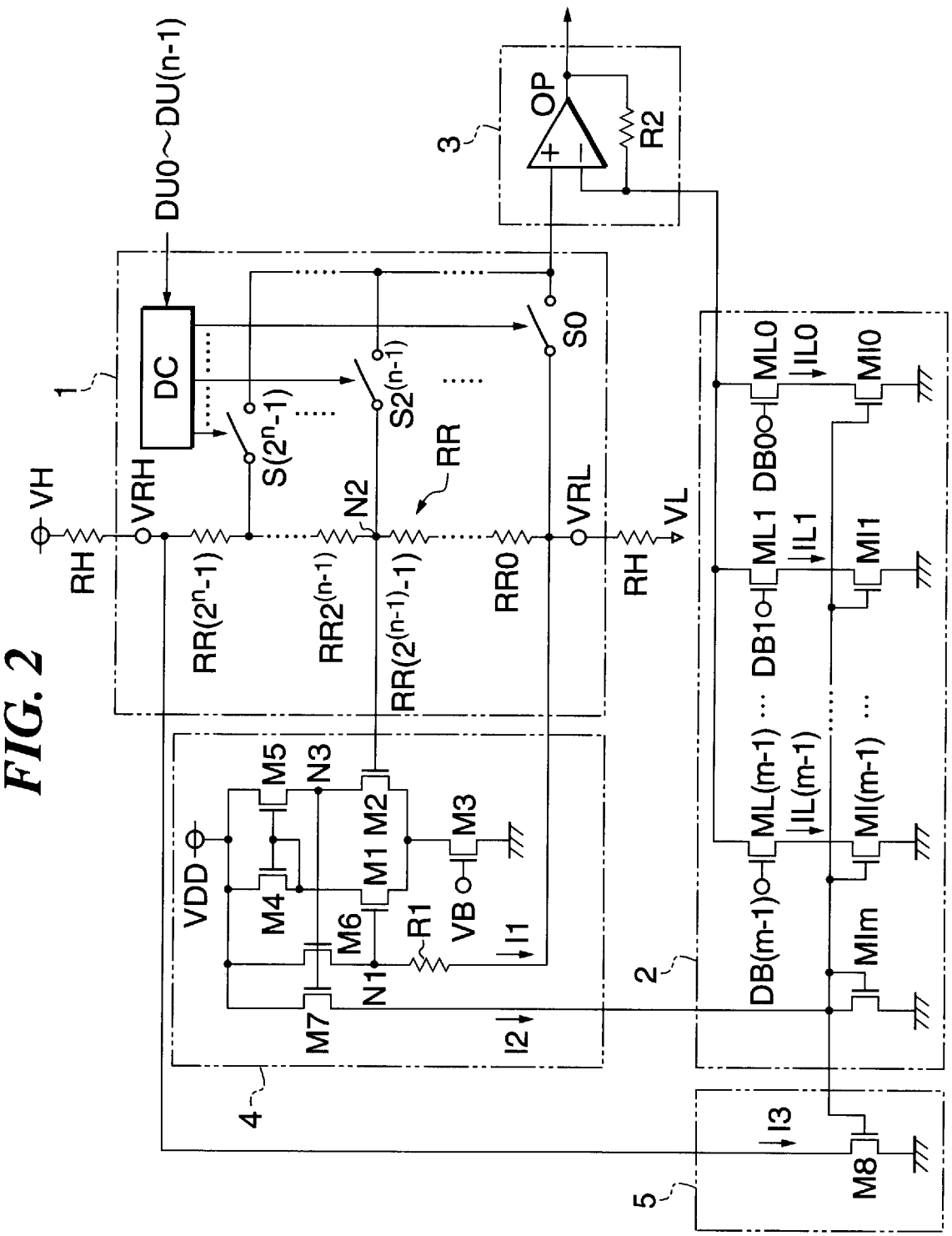
FIG. 2 is a circuit diagram showing the circuit arrangement of a digital-to-analog converter according to a second embodiment of the present invention.
Figure 3:
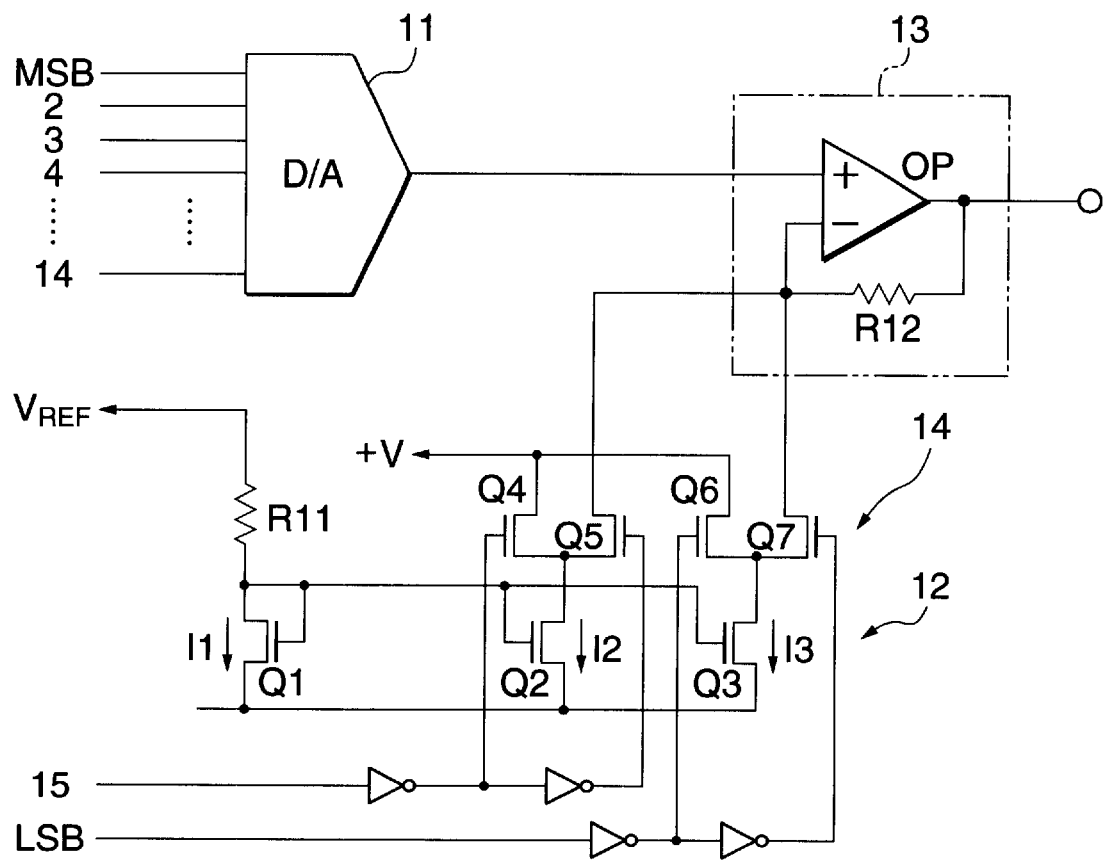
FIG. 3 is a circuit diagram showing the circuit arrangement of a conventional digital-to-analog converter.

Referring next to FIG. 2, a detailed description will be given of a D/A converter according to a second embodiment of the present invention. FIG. 2 is a circuit diagram showing the circuit arrangement of the D/A converter according to the second embodiment of the present invention.

The D/A conversion section 2 in FIG. 2 differs from the one in FIG. 1 in that the more significant reference voltage vrh is supplied from an external resistor RH connected to a power supply VH at a high potential side at the outside, a less significant reference voltage vrl is supplied from an external resistor RL connected to a power supply VL at a low potential side at the outside, and there is additionally provided a current removing circuit 5 for drawing or sinking the current I1, which is inputted to the lower end of the resistor string RR through the resistor R1, from the upper end of the resistor string RR. Otherwise, the D/A converter in FIG. 2 has the same circuit arrangement as the one in FIG. 1. Thus, the same parts are denoted by the same reference numerals, and a description thereof will be omitted.

As shown in FIG. 2, the current removing circuit 5 is comprised of an n channel MOS transistor M8. The transistor M8 has a source grounded, a drain connected to the upper end of the resistor string RR, and a gate connected to the gate of the transistor MIm. The transistor M8 has a predetermined gate width that is equal to the gate width W of the transistor MIm. Thus, the transistor M8 and the transistor MIm constitute a current mirror circuit, whereby a current I3 flowing through the transistor M8 has the current value i1 similarly to the transistor MIm.

With the above arrangement, even if the current I1 flows from the transistor M6 of the control part 4 into the resistor string RR through the resistor R1, the transistor M8 is able to draw a current of the current value i1 of the current I1 from the upper end of the transistor string RR. As a result, the current flowing through the resistor string RR is equal to the one of the first embodiment, and the digital data can be converted into the analog signal in the same manner as in the first embodiment.

Assuming that the current value of the current flowing through the resistor string RR is i0, currents flowing through the external resistors RH, RH have an equal current value represented by (i0+i1). If the voltage of the power supply VH is denoted by vh and the voltage of the power supply vl, the resistance value rh of the external resistor RH is determined by the following equation:

$$Rh = (vh - vrh)/(i0 + i1) \tag{3}$$

A resistance value rl of the external resistor RL is determined by the following equation:

$$Rl = (vrl - Vl)/(i0 + i1) \tag{4}$$

On the other hand, assuming that the total resistance value of the resistor string RR is denoted by ra, the current value i0 is determined by the following equation:

$$i0 = (vrh - vrl)/ra \tag{5}$$

As has been described with respect to the first embodiment, the current value i1 is determined by the following equation:

$$i1 = (vrh - vrl)/(r2 \times 2^{(m+n)}) \tag{6}$$

For the reasons stated above, if the total resistance value ra of the resistor string RR and the resistance value r2 of the resistor R2 are presented to the user, the user can find the resistance values rh, rl of the external resistors RH, RL relating to desired more significant and less significant reference voltages. It is therefore possible for the user to make use of the desired more significant and less significant reference voltages.

In the above described embodiments, the more significant bit data conversion section 1 is a voltage mode D/A converter comprised of a resistor string and CMOS switches, but it may also be another type of voltage mode D/A converter or a current mode D/A converter. In addition, the less significant bit data conversion section 2 is a current mode D/A converter comprised of MOS transistors, but it may also be another type of current mode D/A converter or a voltage mode D/A converter.

What is claimed is:

1. A digital-to-analog converter comprising:

a more significant data converting device that converts more significant bit data of digital data into a more significant analog signal corresponding to said more significant bit data by using an adjustable reference voltage inputted from outside;

a less significant data converting device that converts less significant bit data of the digital data into a less significant analog signal corresponding to said less significant bit data wherein said less significant data converting device comprises a current output device that outputs a less significant analog current signal having a current corresponding to said less significant bit data;

a control device that controls said less significant data converting device in such a manner as to output said less significant analog signal according to said adjustable reference voltage wherein said control device comprises a regulating device that detects a predetermined voltage within a range of said adjustable reference voltage and regulates a current value of said less significant analog current signal according to the detected voltage; and an adding device that adds said more significant analog signal and said less significant analog signal, thereby outputting an analog signal corresponding to said digital data.

2. The digital-to-analog converter according to claim 1, wherein said more significant data converting device comprises a voltage output device that outputs a more significant analog voltage signal having a voltage corresponding to said more significant bit data by using said adjustable reference voltage.

3. A digital-to-analog converter according to claim 1, wherein said adding device comprises a current-to-voltage converting device that converts said less significant analog current signal into a less significant analog voltage signal and adds said less significant analog voltage signal to said more significant analog voltage signal.

4. A digital-to-analog converter according to claim 2, wherein said adding device comprises a current-to-voltage converting device that converts said less significant analog current signal into a less significant analog voltage signal and adds said less significant analog voltage signal to said more significant analog voltage signal.

5. A digital-to-analog converter according to claim 2, wherein said voltage output device comprises a more significant reference voltage terminal supplied with a more significant reference voltage of said adjustable reference voltage, a less significant reference voltage terminal supplied with a less significant voltage of said adjustable reference voltage, and a resistor string having one end thereof connected to said more significant reference voltage terminal and another end thereof connected to said less significant reference voltage terminal, and having a plurality of outputs, for dividing said adjustable reference voltage in divided voltages corresponding to a number of bits of said more significant bit data and outputting the divided voltages from the plurality of outputs.

6. A digital-to-analog converter according to claim 5, wherein said regulating device comprises to a power supply at a high potential side, a MOS transistor having one end thereof connected to said power supply, a resistor having one end thereof connected to said MOS transistor and another end thereof connected to said other end of said resistor string, a differential circuit having a first input connected to a junction between said MOS transistor and said resistor, a second input connected to a predetermined one of said plurality of outputs of said resistor string, and an output connected to a gate of said MOS transistor, and a current sinking device that sinks a current flowing into said other end of said resistor string from said MOS transistor through said resistor, from said one end of said resistor string.

7. A digital-to-analog converter according to claim 1, wherein said regulating device detects a voltage at a median point between a more significant reference voltage and a less significant reference voltage of said adjustable reference voltage.

8. A digital-to-analog converter according to claim 1, wherein said less significant data converting device comprises a current producing device that multiplies a current value of a current corresponding to said predetermined voltage a predetermined number of times according to the current corresponding to the predetermined voltage and said number of bits of said less significant bit data, thereby producing a plurality of currents having different current values, and a less significant analog current signal producing device that adds said plurality of currents produced by said current producing device according to said less significant bit data, thereby producing said less significant analog current signal having a current corresponding to said less significant bit data.

* * * * *